(12) United States Patent
Chow et al.

(10) Patent No.: US 8,124,460 B2
(45) Date of Patent: Feb. 28, 2012

(54) INTEGRATED CIRCUIT PACKAGE SYSTEM EMPLOYING AN EXPOSED THERMALLY CONDUCTIVE COATING

(75) Inventors: Seng Guan Chow, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 648 days.

(21) Appl. No.: 11/458,078

(22) Filed: Jul. 17, 2006

(65) Prior Publication Data
US 2008/0012098 A1    Jan. 17, 2008

(51) Int. Cl.
*H01L 23/495* (2006.01)
(52) U.S. Cl. ........ 438/123; 438/121; 438/106; 438/124; 257/666; 257/677; 257/680; 257/679; 257/E23.031; 257/E23.059
(58) Field of Classification Search .................. 257/666, 257/677, E23.031, E23.059; 438/123, 106, 438/121, 124
See application file for complete search history.

(56) References Cited

U.S. PATENT DOCUMENTS

| | | | |
|---|---|---|---|
| 5,528,076 A * | 6/1996 | Pavio ............................. 257/666 |
| 5,773,362 A | 6/1998 | Tonti et al. |
| 5,776,800 A | 7/1998 | Hamburgen et al. |
| 6,191,494 B1 | 2/2001 | Ooyama et al. |
| 6,251,707 B1 * | 6/2001 | Bernier et al. ................. 438/122 |
| 6,414,385 B1 * | 7/2002 | Huang et al. ................... 257/690 |
| 6,583,499 B2 | 6/2003 | Huang et al. |
| 6,724,075 B2 | 4/2004 | Lee et al. |
| 6,784,537 B2 * | 8/2004 | Moriguchi ..................... 257/706 |
| 6,800,508 B2 * | 10/2004 | Kimura ........................ 438/123 |
| 6,818,976 B2 * | 11/2004 | Kang et al. .................... 257/684 |
| 7,049,696 B2 | 5/2006 | Kubo |
| 2002/0158331 A1 * | 10/2002 | Umehara et al. .............. 257/712 |
| 2003/0138991 A1 | 7/2003 | Kung |
| 2004/0238857 A1 * | 12/2004 | Beroz et al. .................... 257/232 |
| 2006/0027635 A1 * | 2/2006 | Schaenzer et al. ............ 228/246 |
| 2007/0059865 A1 * | 3/2007 | Huang et al. .................. 438/123 |
| 2007/0085173 A1 * | 4/2007 | Fan ................................ 257/666 |

* cited by examiner

*Primary Examiner* — Marc Armand
(74) *Attorney, Agent, or Firm* — Mikio Ishimaru

(57) ABSTRACT

An integrated circuit package system includes providing a leadframe that is coplanar with a bottom surface of the integrated circuit package system to which is attached a device with a thermally conductive coating that is coplanar with the bottom surface of the integrated circuit package system to the leadframe, the device having the characteristics of being singulated from a wafer and the thermally conductive coating having the characteristics of being singulated from a wafer level thermally conductive coating and encapsulating the device with an encapsulation material that leaves the thermally conductive coating exposed for thermal dissipation.

15 Claims, 4 Drawing Sheets

INTEGRATED CIRCUIT PACKAGE SYSTEM EMPLOYING AN EXPOSED THERMALLY CONDUCTIVE COATING

TECHNICAL FIELD

The present invention relates generally to integrated circuits, and more particularly to integrated circuit package systems employing exposed thermally conductive coatings.

BACKGROUND ART

Integrated circuits are what power many of today's consumer electronics, for instance, cellphones, video cameras, portable music players, computers, etc. Integrated circuit manufacturing can generally be divided into front-end process steps and back-end process steps. Typical front-end integrated circuit fabrication process steps may take as many as six to eight weeks and may involve hundreds of process steps.

Back-end integrated circuit manufacturing can be further divided into two distinct processes, final assembly and packaging. Integrated circuit final assembly usually involves the separation of known good die from a wafer, followed by attaching the die to a leadframe or substrate. Interconnections, such as wire bonds, are used to electrically connect the die to the leadframe or substrate. After final assembly, integrated circuit packaging most commonly encapsulates the die/substrate combination in a resin package, such as a plastic molding compound. This resin package, including the die/substrate combination, provides environmental protection from various conditions, such as moisture, temperature, and mechanical vibration, while providing leads for connection to the next higher level of assembly. Unfortunately, many of these packages suffer from increased package profile and/or poor thermal dissipation.

Thus, a need still remains for a low profile integrated circuit package system that exhibits good thermal dissipation. In view of the ever increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system, which includes providing a leadframe that is coplanar with a bottom surface of the integrated circuit package system to which is attached a device with a thermally conductive coating that is coplanar with the bottom surface of the integrated circuit package system to the leadframe, the device having the characteristics of being singulated from a wafer and the thermally conductive coating having the characteristics of being singulated from a wafer level thermally conductive coating and encapsulating the device with an encapsulation material that leaves the thermally conductive coating exposed for thermal dissipation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
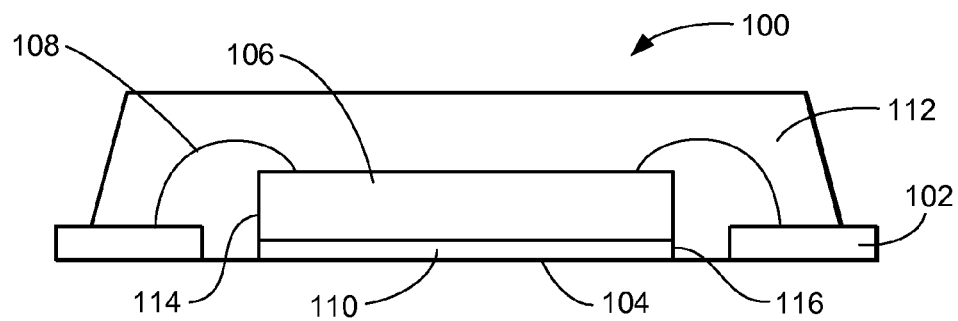
FIG. 1 is a sectional view of an integrated circuit package system in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs.

Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the device, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a sectional view of an integrated circuit package system 100 in accordance with an embodiment of the present invention. The integrated circuit package system 100 includes a leadframe 102, a bottom surface 104, a device 106, a wire bond 108, a thermally conductive coating 110, and an encapsulation material 112. As an exemplary illustration, the integrated circuit package system 100 may include a power package.

The leadframe 102 may include a thin metal sheet, a conductive plated pattern on plastic tape, or any structure suitable for electrically interconnecting the device 106 to external electrical circuits. By way of example, the leadframe 102 may include a leadframe with dual in-line leads, quad flat pack leads, gull-wing leads, j-leads, leadless leads that wrap around the package edge to maintain a low profile, pin grid array leads, or ball grid array leads. However, it is to be understood that the present invention is not to be limited to these examples. In accordance with the invention, the leadframe 102 may include any electrical interconnection structure that facilitates the incorporation of the integrated circuit package system 100 into a higher-level assembly, such as a printed circuit board or other suitable structure for supporting the integrated circuit package system 100.

Notably, the leadframe 102 is coplanar with the bottom surface 104 of the integrated circuit package system 100, thereby reducing the profile of the package. In at least one embodiment, the leadframe 102 can be described as coplanar with the entire bottom surface 104 of the integrated circuit package system 100. In yet another embodiment, the leadframe 102 can be described as planar or flat because the leadframe 102 resides within a single plane.

The device 106 may include semiconductor chips and integrated circuit packages selected from active components, passive components, stacked components, power components, and so forth, in numerous configurations and arrangements as may be needed. It is to be understood that the device 106 covers a wide range of semiconductor chip and integrated circuit package configurations involving various sizes, dimensions, and electrical contact techniques, and the type of chip or package configuration employed should only be limited by the design specifications of the integrated circuit package system 100.

Furthermore, by way of example, the integrated circuit package system 100 and/or the device 106 may also include integrated circuit package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. As exemplary illustrations, the integrated circuit package system 100, itself, may include PiP and PoP configurations and/or the device 106 may include PiP and PoP configurations.

Furthermore, the device 106 will exhibit or have the characteristics of being singulated from a wafer (described further below) along a device edge 114. The characteristics of singulation may include physical features, such as micro-abrasions, which are indicative of a lasing or mechanical dicing process.

The wire bond 108 electrically attaches the device 106 to the leadframe 102. The wire bond 108 is deposited using materials and techniques well known within the art and is currently only limited by the technology of wire bond equipment and the minimum required operating space. By way of example, the wire bond 108 may include materials such as gold or aluminum.

The thermally conductive coating 110 is formed in direct contact with the backside surface of the device 106 and is coplanar with the bottom surface 104 of the integrated circuit package system 100. The thermally conductive coating 110 can be coplanar with the bottom surface of the leadframe 102. The thermally conductive coating 110 may be made from materials including gold, aluminum, and copper or its alloy, for example. However, it is to be understood that the present invention is not to be limited to these examples. In accordance with the invention, the thermally conductive coating 110 should only be limited to materials that are thermally conductive and/or solder wettable. Accordingly, the thermally conductive coating 110 can provide a thermal path between the device 106 and external structures, such as a second level assembly structure or a heat sink.

Additionally, the material chosen for the thermally conductive coating 110 may also possess the following qualities: a high modulus strength for structural support, low density for light-weight applications, and a coefficient of thermal expansion similar to that of the device 106 for stress reduction.

The thermally conductive coating 110 can be applied to the backside of the device 106, or more generally the backside of a wafer, by chemical processes and/or physical processes. By way of example, the chemical processes may include plasma assisted chemical vapor deposition and electroplating/electroless plating, and the physical processes may include techniques such as sputtering. However, it is to be understood that the type of deposition process chosen is not essential, what is important is that the thermally conductive coating 110 deposited on the backside of the device 106 exhibit properties such as thermal conductivity and solder wettability.

The thickness of the thermally conductive coating 110 deposited on the backside of the device 106 is generally controlled by factors such as, maintaining a low package profile, thermal conductivity, and modulus strength. By way of example, the thermally conductive coating 110 may be deposited to a thickness of about fifteen micrometers or less. More specifically, the thermally conductive coating 110 should be deposited to a thickness between about five and fifteen micrometers.

Notably, the thermally conductive coating 110 is coplanar with the bottom surface 104 of the integrated circuit package system 100, with a portion exposed to the external environment. By exposing the thermally conductive coating 110 to the external environment, the integrated circuit package system 100 exhibits an improved thermal dissipation ability. This improved thermal dissipation ability is further enhanced by choosing to construct the thermally conductive coating 110 from a high thermal conductivity material.

Additionally, the low profile design of the integrated circuit package system 100, afforded by the thermally conductive coating 110, naturally improves thermal dissipation. The low profile design (i.e.—a reduced thickness package) improves thermal dissipation because the heat flux of a solid object is inversely proportional to the thickness of the object, noting Fourier's law of heat conduction in solids.

Notably, by improving the ability of the integrated circuit package system 100 to dissipate heat, the reliability and the useful life of the integrated circuit package system 100 can be improved.

Additionally, the thermally conductive coating 110 may also include a material that is amenable to being solder wettable. By constructing the thermally conductive coating 110 from a solder wettable material, techniques such as surface mount technology can be employed when attaching the integrated circuit package system 100 to a second level higher assembly. Furthermore, the solder acts to provide an additional thermal conductive path to dissipate heat away from the integrated circuit package system 100.

Furthermore, the thermally conductive coating 110 will exhibit or have the characteristics of being singulated from a wafer level thermally conductive coating (described further below) along a thermally conductive coating edge 116. The characteristics of singulation may include physical features, such as micro-abrasions, which are indicative of a lasing or mechanical dicing process.

The encapsulation material 112, such as a plastic molding compound, is deposited over the leadframe 102, the device 106, the wire bond 108, and part of the thermally conductive coating 110. It is important to note that the encapsulation material 112 does not cover the exposed portion of the thermally conductive coating 110 on the bottom surface 104 of the integrated circuit package system 100. The bottom surface of the encapsulation material 112 can be coplanar with the bottom surface of the leadframe 102 and the exposed surface of the thermally conductive coating 110. The encapsulation material 112 and molding techniques using it are well known in the art and not repeated herein.

FIGS. 2-7 depict by way of example and not by limitation, an exemplary process flow for the formation of a wafer employing the thermally conductive coating 110, and it is not to be construed as limiting.

Figure 2:
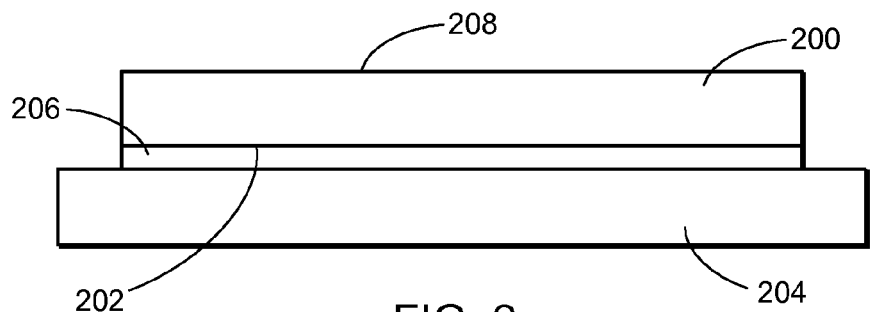
FIG. 2 is a side view of a wafer in an initial stage of manufacture in accordance with an embodiment of the present invention.

Referring now to FIG. 2, therein is shown a side view of a wafer 200 in an initial stage of manufacture in accordance with an embodiment of the present invention. As is known in the art, the wafer 200 may include various active components and passive components in numerous configurations and arrangements as may be needed. For purposes of processing, the wafer frontside 202 is attached to a support plate 204 by an adhesive 206. The wafer backside 208 is left exposed for further processing steps. The support plate 204 helps to maintain the structural integrity of the wafer 200 during processing. This stage can be generally referred to as plate mounting.

Figure 3:
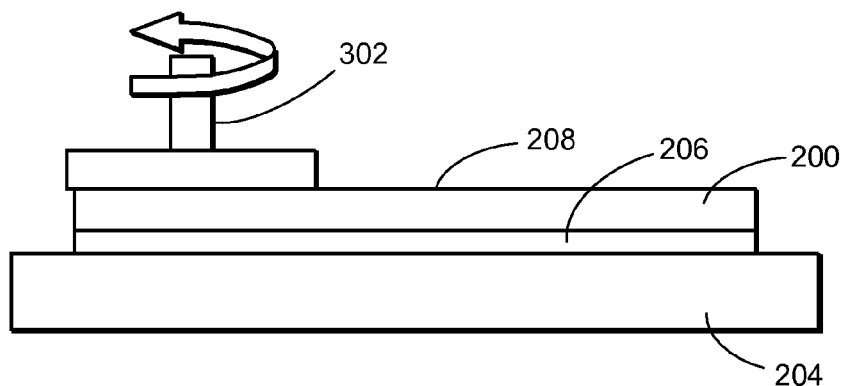
FIG. 3 is the structure of FIG. 2 during a backside etch process.

Referring now to FIG. 3, therein is shown the structure of FIG. 2 during a backside etch process. The wafer 200 is attached to the support plate 204 by the adhesive 206. The wafer 200, or more specifically the wafer backside 208, can be etched by a polisher 302, for purposes of promoting adhesion of subsequently deposited layers or it can be etched to reduce the thickness of the wafer 200 (i.e.—for purposes of improved thermal dissipation and dicing). However, it is to be understood that the etching of the wafer 200 by the polisher 302 is exemplary, and that the wafer 200 can be etched by any known dry or wet etch process. This stage can generally be referred to as etching.

Figure 4:
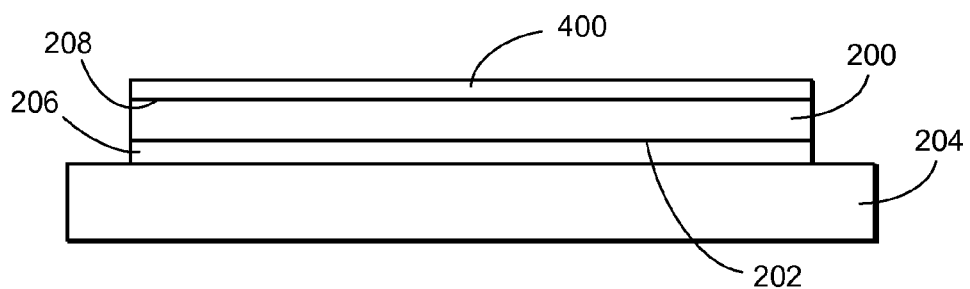
FIG. 4 is the structure of FIG. 3 after the formation of a thermally conductive coating on a wafer backside.

Referring now to FIG. 4, therein is shown the structure of FIG. 3 after the formation of a wafer level thermally conductive coating 400 on the wafer backside 208. The wafer frontside 202 is attached to the support plate 204 by the adhesive 206, while the wafer backside 208 is exposed for receiving the wafer level thermally conductive coating 400. The wafer level thermally conductive coating 400 can be deposited by chemical or physical processes, for example. Not only does the wafer level thermally conductive coating 400 act as a thermal dissipation layer, but it may also act to reinforce the wafer 200 and prevent warpage. This stage can generally be referred to as coating.

Figure 5:
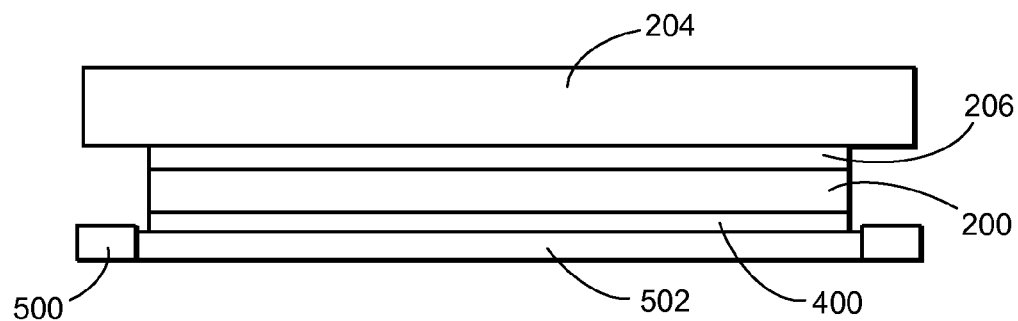
FIG. 5 is the structure of FIG. 4 after the attachment of a dicing tape.

Referring now to FIG. 5, therein is shown the structure of FIG. 4 after the attachment of a dicing tape 502. During this process step the support plate 204 is flipped over and the wafer level thermally conductive coating 400 is attached to a mounting frame 500 by the dicing tape 502. The wafer 200 is still attached to the support plate 204 by the adhesive 206. This step is generally referred to as dice tape lamination.

Figure 6:
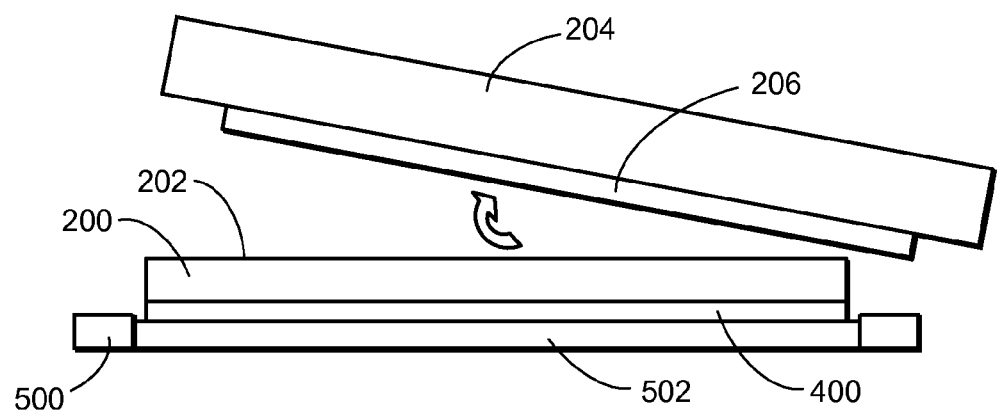
FIG. 6 is the structure of FIG. 5 after the removal of a support plate and an adhesive.

Referring now to FIG. 6, therein is shown the structure of FIG. 5 after the removal of the support plate 204 and the adhesive 206. The wafer 200 and the wafer level thermally conductive coating 400 remain attached to the mounting frame 500 by the dicing tape 502. After removal of the support plate 204 and the adhesive 206, the wafer frontside 202 is exposed for later processing steps. This step is generally referred to as plate removal.

Figure 7:
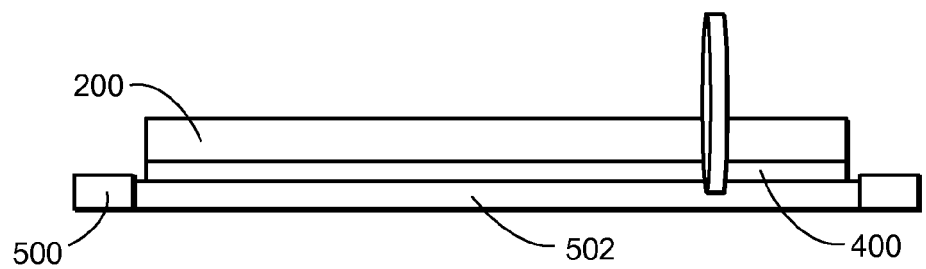
FIG. 7 is the structure of FIG. 6 during dicing of a wafer.

Referring now to FIG. 7, therein is shown the structure of FIG. 6 during dicing of the wafer 200. The mounting frame 500 and the dicing tape 502 support the wafer 200 and the wafer level thermally conductive coating 400 during dicing. By way of example, the wafer 200 can be diced by mechanical or lasing means. This process step separates each die or chip from the wafer 200 and prepares them for incorporation within an integrated circuit package. Notably, each singulated die or chip is coated with the wafer level thermally conductive coating 400. Generally, this step is referred to as dicing.

Alternative Embodiment

Figure 8:
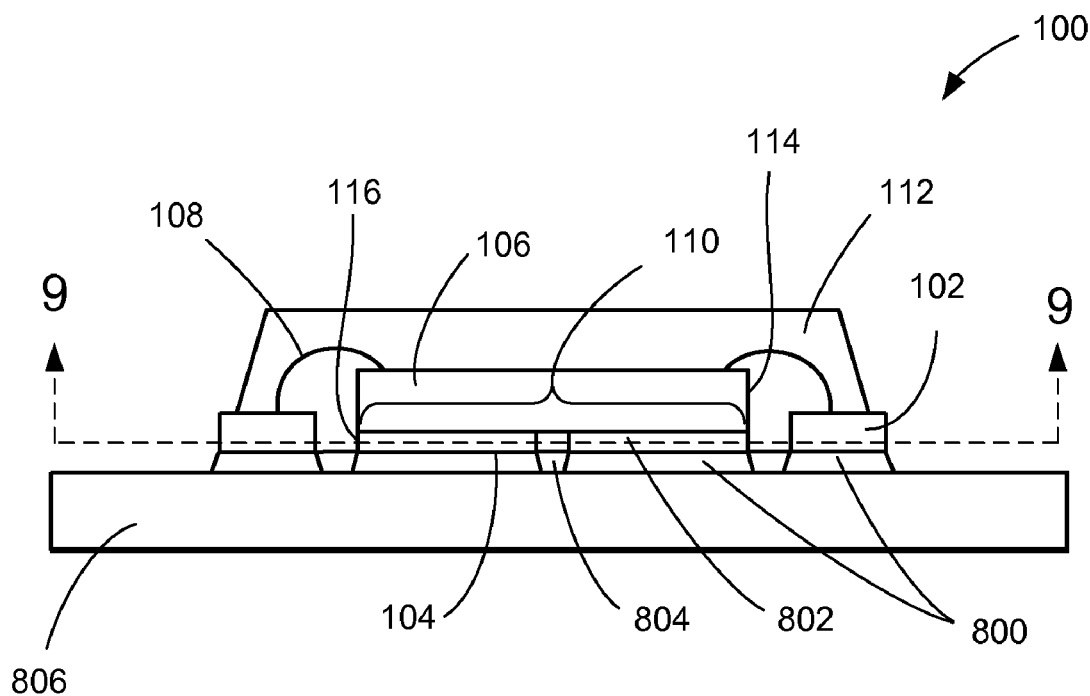
FIG. 8 is a sectional view of an integrated circuit package system in accordance with another embodiment of the present invention.
Figure 9:
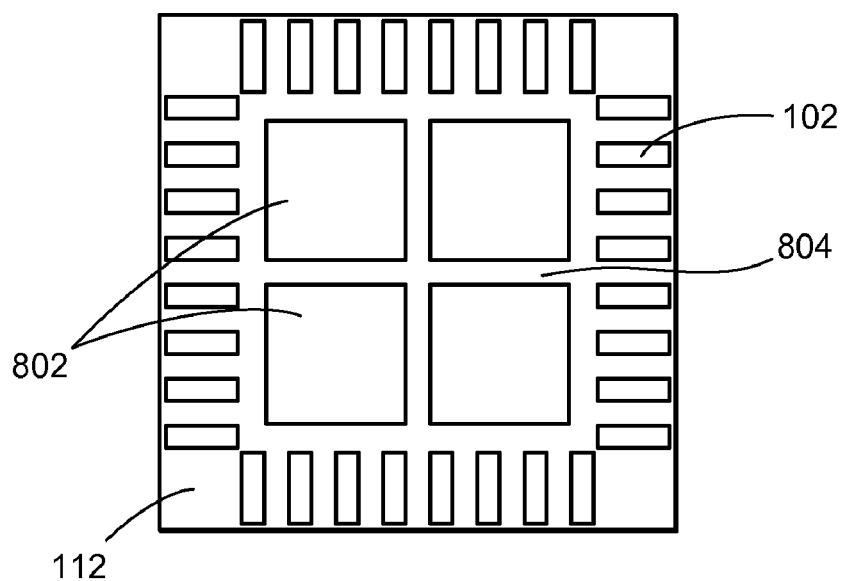
FIG. 9 is a cross-sectional bottom view of FIG. 8 along line 9-9 in accordance with an embodiment of the present invention.

The following alternative embodiment, FIGS. 8-9, depict by way of example and not by limitation, another embodiment for the integrated circuit package system 100.

Referring now to FIG. 8, therein is shown a sectional view of the integrated circuit package system 100 in accordance with another embodiment of the present invention. The integrated circuit package system 100 includes the leadframe 102, the bottom surface 104, the device 106, the wire bond 108, the thermally conductive coating 110, the encapsulation material 112, thermally conductive pads 802 and channels 804. The integrated circuit package system 100 is attached to a substrate 806 via a solder 800.

It has been discovered by the present inventors, that under certain conditions, the integrated circuit package system 100 can be subject to misalignment. For example, as the size of an integrated circuit chip becomes larger, the surface area of the backside of the integrated circuit chip, also becomes larger. Consequently, the surface tension of a fusible material at the interface with the integrated circuit chip backside will be significantly larger than the surface tension of the fusible material at the interface with a lead. This dissimilarity between the amount of energy needed to increase the surface area of the fusible material (i.e.—the surface tension of the fusible material) at the integrated circuit chip interface versus the lead interface can cause misalignment of the integrated circuit package system 100 in the X, Y and Z directions during a surface mount process.

Fortunately, the present inventors have discovered that the possibility of misalignment for larger integrated circuit chip systems can be ameliorated by forming the integrated circuit package system 100 with thermally conductive pads 802. The thermally conductive pads 802 can be formed by processing the thermally conductive coating 110 to form channels 804. Processing methods for forming the channels 804 may include etching and/or selective deposition. For example, portions of the thermally conductive coating 110 can be selectively etched off after the coating step of FIG. 4 or the coating step of FIG. 4 may selectively deposit portions of the thermally conductive coating 110 (i.e.—at the wafer 200, of FIG. 2, level). Alternatively, portions of the thermally conductive coating 110 can be selectively etched off or selectively deposited at the chip level, as well. Furthermore, additional alternative methods may employ both selective etching and selective deposition to form the thermally conductive pads 802 at the wafer 200 level or at the chip level.

Notably, the bottom surface 104 of the thermally conductive pads 802 are exposed to the external environment and are coplanar with the leadframe 102, thereby helping to reduce the overall profile of the integrated circuit package system 100.

The solder 800 interconnects the thermally conductive pads 802 and the substrate 806. As can be seen, the surface area of the thermally conductive coating 110 and the surface area of the solder 800 have been reduced by forming the channels 804. By reducing the surface area of the thermally conductive coating 110, a concomitant result is the ability to control the surface tension of the solder 800 when interfacing with the thermally conductive pads 802. The ability to control the surface tension of the solder 800 helps to prevent and eliminate the misalignment problems that occur during surface mount of the integrated circuit package system 100.

The substrate 806 may include a second level package assembly, such as a printed circuit board and/or additional semiconductor packaging, for example.

Furthermore, the device 106 will exhibit or have the characteristics of being singulated from the wafer 200, of FIG. 2, along a device edge 114. Additionally, the thermally conductive coating 110 will exhibit or have the characteristics of being singulated from the wafer level thermally conductive coating 400, of FIG. 4, along a thermally conductive coating edge 116. The characteristics of singulation may include physical features, such as micro-abrasions, which are indicative of a lasing or mechanical dicing process.

Referring now to FIG. 9, therein is shown a cross-sectional bottom view of FIG. 8 along line 9-9 in accordance with an embodiment of the present invention. This embodiment of the integrated circuit package system 100 depicts the leadframe 102, the encapsulation material 112, the thermally conductive pads 802 and the channels 804.

Although, the present embodiment depicts four of the thermally conductive pads 802, it is not to be construed as limiting. In accordance with the scope of the present invention, the integrated circuit package system 100 may include any number of the thermally conductive pads 802. it is also to be understood that the present invention covers a wide range of configurations involving various shapes, sizes and locations of the thermally conductive pads 802. As an exemplary illustration, the number, shape, size and location of the thermally conductive pads 802 can be determined by the strategic reduction or minimization of surface tension of the solder 800, of FIG. 8, and/or the prevention of misalignment of the integrated circuit package system 100, of FIG. 8, during a surface mount process.

Notably, the present invention provides additional aspects. For example, the channels 804 beneath the device 106, of FIG. 8, provide extra area for routing signal traces when mounting the integrated circuit package system 100 to a printed circuit board. Furthermore, the channels 804 provide an out-gassing path for gas trapped between the device 106 and the substrate 806, of FIG. 8. This out-gassing path can help to prevent the occurrence of misalignment, as well as the formation of internal voids, during a surface mount process. Moreover, the channels 804 help to effectively absorb any thermal stress due to the coefficient of thermal expansion mismatch among the integrated circuit package system 100, the solder 800, and the substrate 806.

Furthermore, it is to be understood that the channels 804, formed between the thermally conductive pads 802, cover a wide range of configurations involving various shapes and sizes. As an exemplary illustration, the shapes and sizes of the channels 804 can be determined by the strategic reduction or minimization of surface tension of the solder 800 and/or the prevention of misalignment of the integrated circuit package system 100 during a surface mount process.

Figure 10:
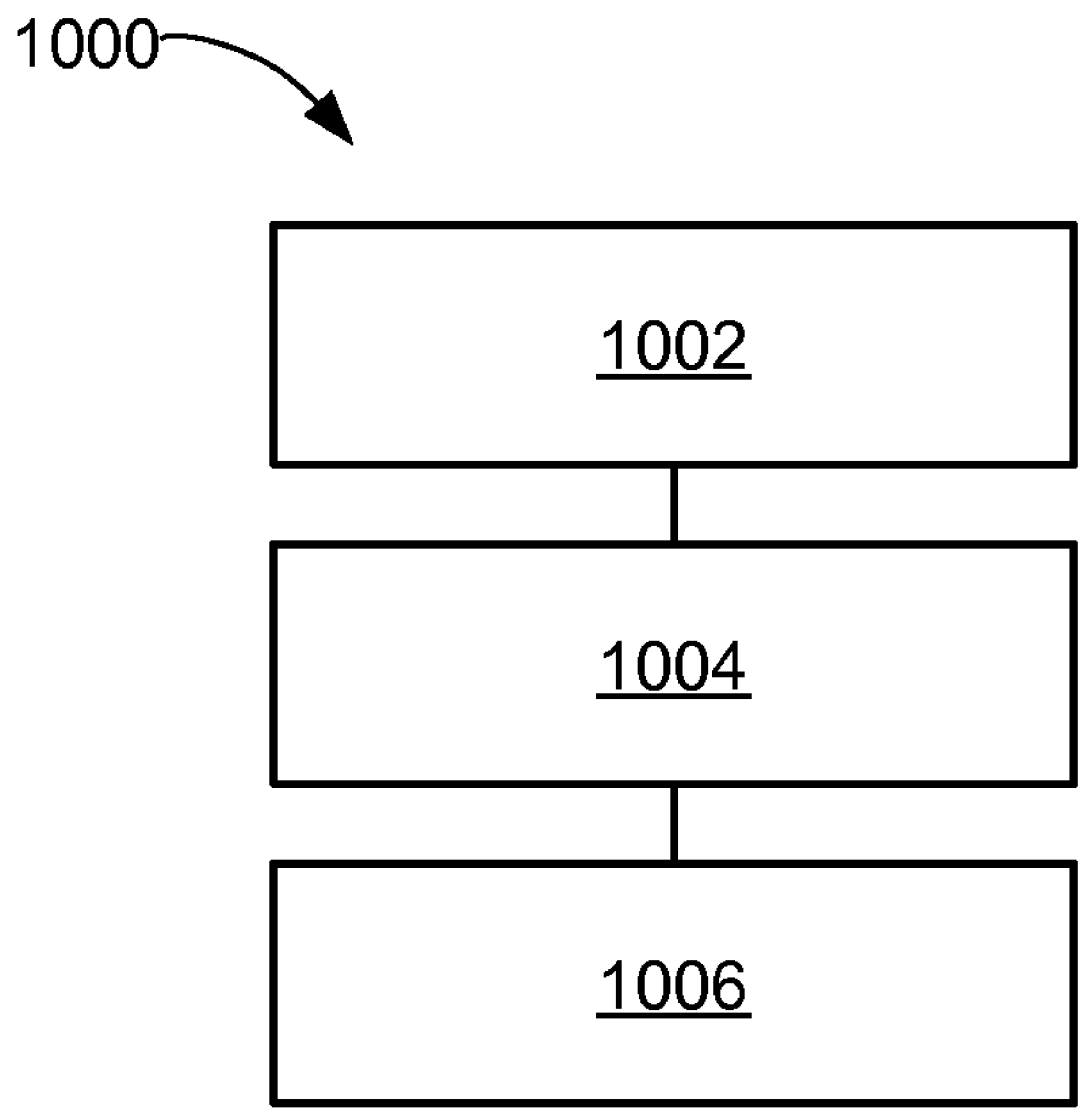
FIG. 10 is a flow chart of an integrated circuit package system for an integrated circuit package system in accordance with an embodiment of the present invention.

Referring now to FIG. 10, therein is shown a flow chart of an integrated circuit package system 1000 for the integrated circuit package system 100 in accordance with an embodiment of the present invention. The integrated circuit package system 1000 includes providing a leadframe that is coplanar with a bottom surface of the integrated circuit package system in a block 1002; attaching a device with a thermally conductive coating that is coplanar with the bottom surface of the integrated circuit package system to the leadframe, the device having the characteristics of being singulated from a wafer and the thermally conductive coating having the characteristics of being singulated from a wafer level thermally conductive coating in a block 1004; and encapsulating the device with an encapsulation material that leaves the thermally conductive coating exposed for thermal dissipation in a block 1006.

It has been discovered that the present invention thus has numerous aspects. A principle aspect is that the present invention displays improved thermal dissipation characteristics for the integrated circuit package system, by incorporating an exposed thermally conductive coating with high thermal conductivity properties.

Another aspect is that the present invention provides a reduced package profile by eliminating the paddle support. By further reducing the overall size of a package structure, the present invention furthers the long-term goal of decreased size semiconductor components. Additionally, the decreased size of the package structure also improves the package's ability to dissipate heat due to the relationship between heat flux and an objects thickness.

Yet another aspect of the present invention is that it improves the reliability performance of the integrated circuit package system. By providing a thermally conductive coating with a similar coefficient of thermal expansion as to that of the device or wafer, the thermally conductive coating can provide a support structure that prevents warpage of the device or wafer, and consequently improve system reliability.

Yet another important aspect of the present invention is that power packages can now be put to use in more systems because of the increased thermal dissipation ability of the integrated circuit package system.

Yet another important aspect of the present invention is that by processing the thermally conductive coating, the potential for misalignment of the integrated circuit package system during surface mount can be reduced.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improved thermal dissipation. The resulting processes and configurations are straightforward, cost-effective, uncomplicated, highly versatile and effective, can be implemented by adapting known technologies, and are thus readily suited for efficiently and economically manufacturing integrated circuit package system devices.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:

providing a planar leadframe;

attaching a device with a thermally conductive coating coplanar with the bottom surface of the leadframe to the leadframe, the device having the characteristics of being singulated from a wafer and the thermally conductive coating having the characteristics of being singulated from a wafer level thermally conductive coating; and encapsulating the device with an encapsulation material leaving the thermally conductive coating exposed for thermal dissipation, the bottom surface of the encapsulation material coplanar with the bottom surface of the leadframe and the exposed surface of the thermally conductive coating.

2. The method as claimed in claim 1 further comprising:
configuring the thermally conductive coating to provide structural support to the device.

3. The method as claimed in claim 1 further comprising:
configuring the thermally conductive coating with a coefficient of thermal expansion similar to that of the device.

4. The method as claimed in claim 1 further comprising:
configuring the thermally conductive coating to include a solder wettable material.

5. The method as claimed in claim 1 further comprising:
processing the thermally conductive coating to prevent misalignment of the device.

6. An integrated circuit package system comprising:

a planar leadframe;

a device with a thermally conductive coating coplanar with the bottom surface of the leadframe attached to the leadframe, the device having the characteristics of being singulated from a wafer and the thermally conductive coating having the characteristics of being singulated from a wafer level thermally conductive coating; and an encapsulation material encapsulating the device except for a portion of the thermally conductive coating exposed to an external environment for thermal dissipation, the bottom surface of the encapsulation material coplanar with the bottom surface of the leadframe and the exposed surface of the thermally conductive coating.

7. The system as claimed in claim 6 wherein:
the thermally conductive coating provides structural support to the device.

8. The system as claimed in claim 6 wherein:
the thermally conductive coating includes a coefficient of thermal expansion similar to that of the device.

9. The system as claimed in claim 6 wherein:
the thermally conductive coating is in direct contact with the device.

10. The system as claimed in claim 6 wherein:
the thermally conductive coating prevents misalignment of the device.

11. The system as claimed in claim 6 wherein:
the device includes semiconductor chips and integrated circuit packages.

12. The system as claimed in claim 6 wherein:
the thermally conductive coating includes thermally conductive pads.

13. The system as claimed in claim 6 wherein:
the thermally conductive coating is deposited to a thickness between about 5 and 15 micrometers.

14. The system as claimed in claim 6 wherein:
the thermally conductive coating includes a solder wettable material.

15. The system as claimed in claim 6 wherein:
the thermally conductive coating includes materials selected from aluminum, gold, copper or its alloy.

* * * * *

UNITED STATES PATENT AND TRADEMARK OFFICE
CERTIFICATE OF CORRECTION

| | | |
|---|---|---|
| PATENT NO. | : 8,124,460 B2 | Page 1 of 1 |
| APPLICATION NO. | : 11/458078 | |
| DATED | : February 28, 2012 | |
| INVENTOR(S) | : Chow et al. | |

It is certified that error appears in the above-identified patent and that said Letters Patent is hereby corrected as shown below:

Column 7:

line 39, delete "it is also" and insert therefor --It is also--

Signed and Sealed this
Sixteenth Day of October, 2012

David J. Kappos
*Director of the United States Patent and Trademark Office*